(12) United States Patent
Kobayashi

(10) Patent No.: US 6,192,060 B1
(45) Date of Patent: Feb. 20, 2001

(54) OPTICAL TRANSMITTER

(75) Inventor: Ippei Kobayashi, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/231,648

(22) Filed: Jan. 15, 1999

(30) Foreign Application Priority Data

Jan. 19, 1998 (JP) ................................................. 10-008042

(51) Int. Cl.[7] ................ H01S 3/00; H01S 3/10; H01S 3/13; H04B 10/04; H04B 10/06
(52) U.S. Cl. .................... 372/38.01; 372/38.02; 372/38.07; 372/29.011; 372/26; 359/180; 359/187
(58) Field of Search ............................. 372/38.01, 38.02, 372/38.07, 26, 29.011, 31, 32, 33; 359/180, 187

(56) References Cited

U.S. PATENT DOCUMENTS

| 4,663,760 | * | 5/1987 | Shimada et al. | 372/31 |
|---|---|---|---|---|
| 5,127,015 | * | 6/1992 | Chikugwa et al. | 372/38 |
| 5,177,755 | * | 1/1993 | Johnson | 372/38 |
| 5,448,629 | * | 9/1995 | Bosch et al. | 359/187 |
| 5,488,621 | * | 1/1996 | Slawson et al. | 372/31 |
| 5,526,164 | * | 6/1996 | Link et al. | 359/187 |
| 5,548,435 | * | 8/1996 | Tahara et al. | 359/180 |
| 5,966,395 | * | 10/1999 | Ikeda | 372/38 |

FOREIGN PATENT DOCUMENTS

| 05063647 | * | 8/1991 | (JP) . |
|---|---|---|---|
| 5-90673 | | 4/1993 | (JP) . |

* cited by examiner

Primary Examiner—Frank G. Font
Assistant Examiner—Armando Rodriguez
(74) Attorney, Agent, or Firm—McGinn & Gibb, PLLC

(57) ABSTRACT

An optical transmitter having an automatic output controlling function converts monitor current of a laser into a voltage and detects an average value of the voltage. The average value is compared with a mark-space ratio outputted from a mark-space ratio detection circuit by a bias control circuit, by which a bias circuit is controlled. Meanwhile, the average value described above is divided by the mark-space ratio from the mark-space ratio detection circuit by an operation circuit, and a resulting value is compared with a reference voltage (Vref) and amplified by a pulse current controller. The pulse current driver is controlled with the amplified output of the pulse current controller. Finally, outputs of the pulse current driver and the bias circuit are added to drive the laser.

6 Claims, 5 Drawing Sheets

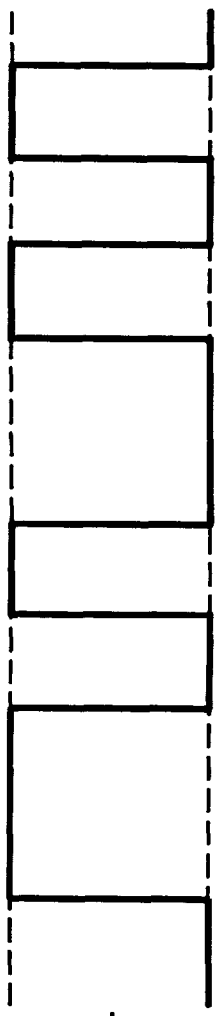
FIG. 4A  INPUT ELECTRIC SIGNAL
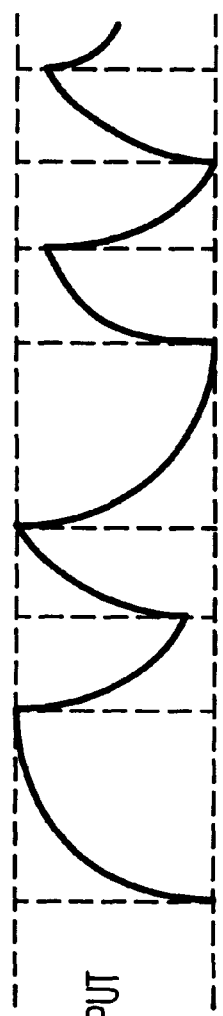
FIG. 4B  CUR./VG. CONVERTER OUTPUT
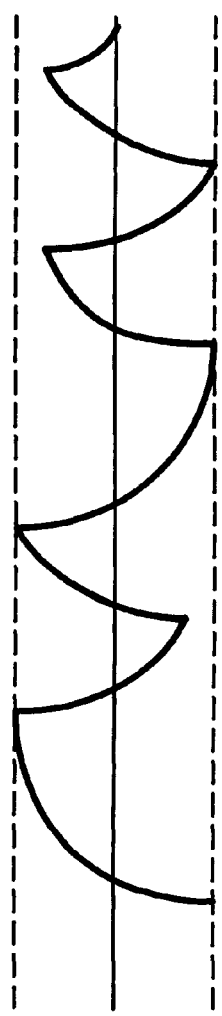
FIG. 4C  OPTICAL OUTPUT AVERAGE VALUE

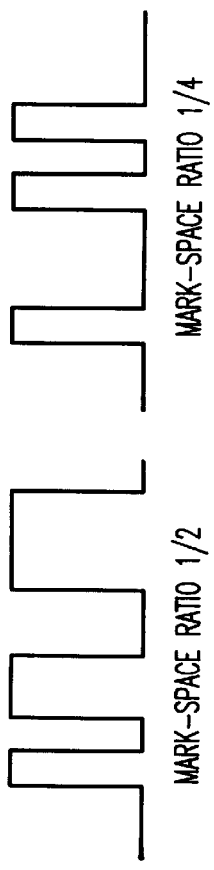
FIG.5A OPTICAL OUTPUT AVERAGE VALUE DETECTION
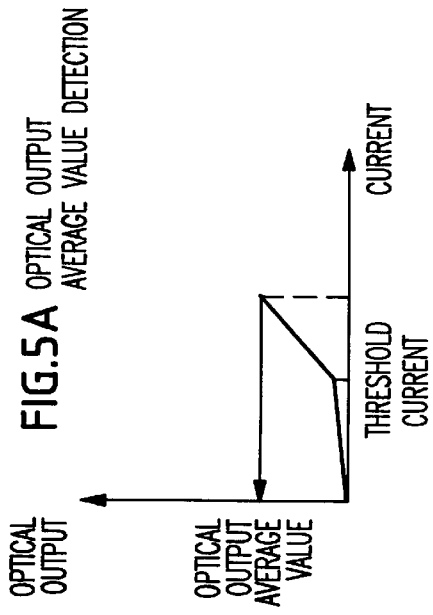
FIG.5B MARK–SPACE RATIO DETECTION
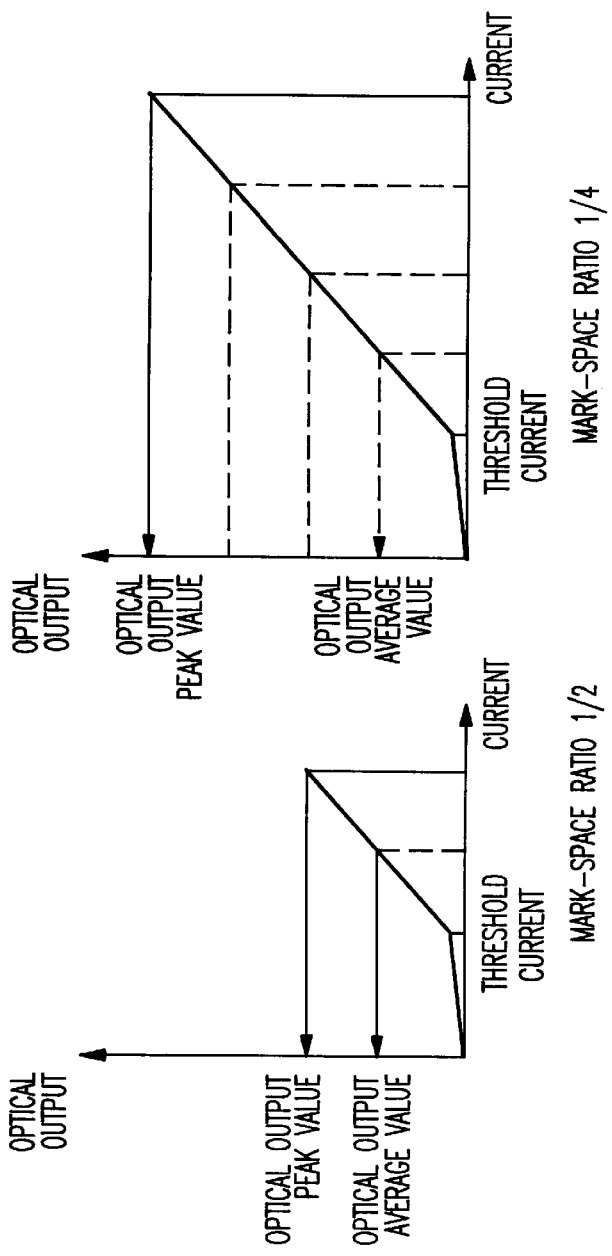
FIG.5C OPTICAL OUTPUT CONTROL

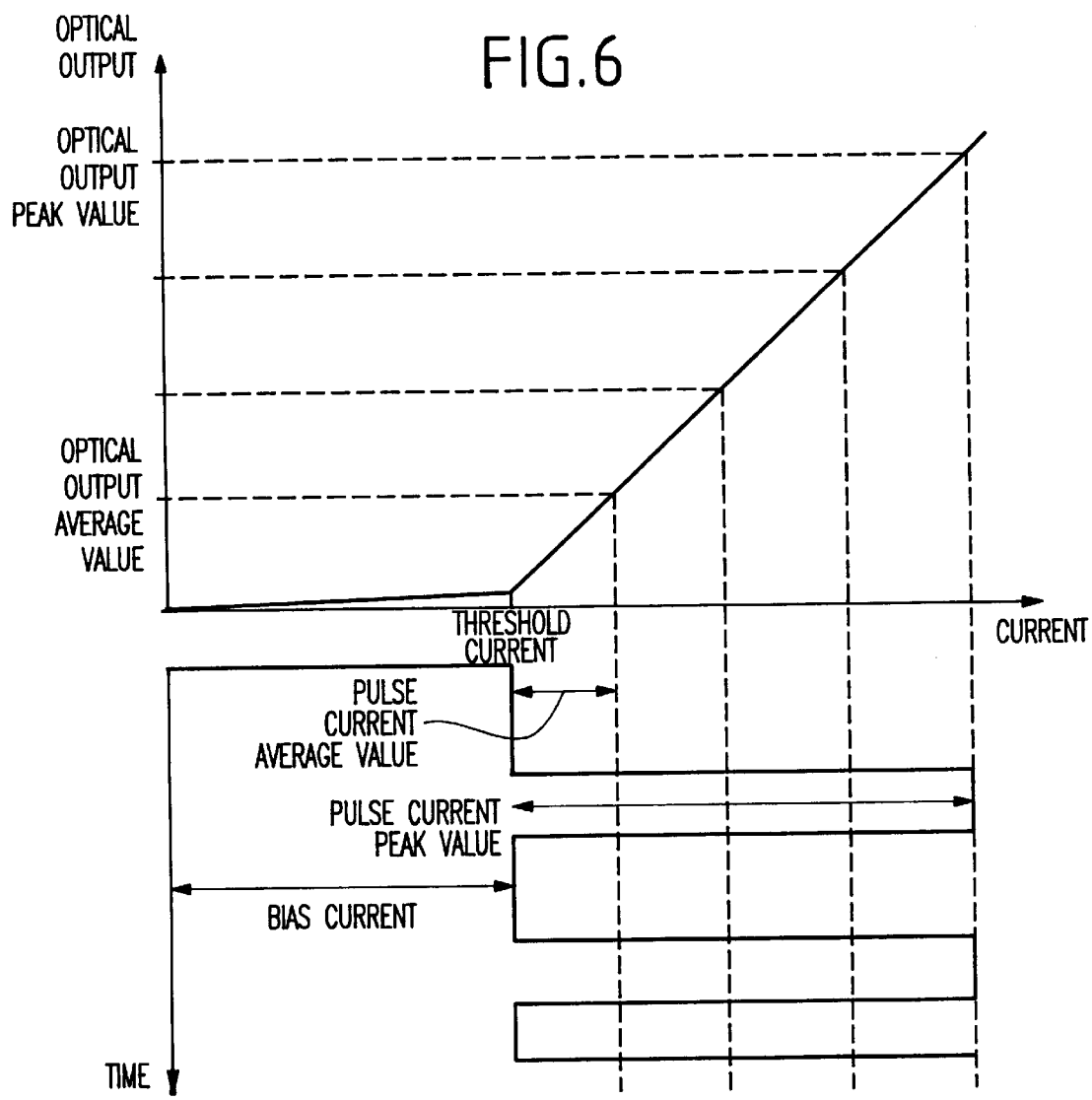
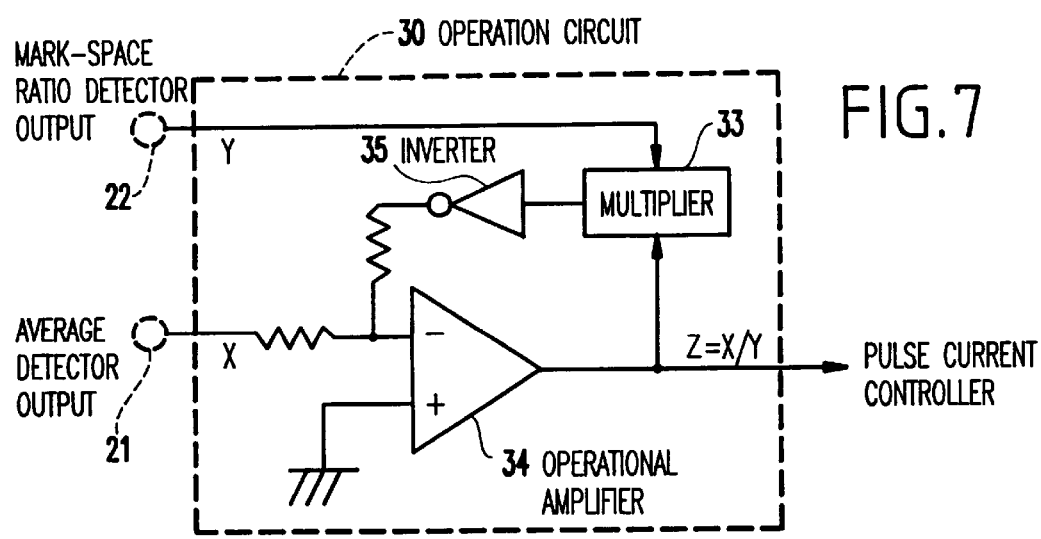

OPTICAL TRANSMITTER

BACKGROUND OF THE INVENTION

1. Field of the Invention

This invention relates to an optical transmitter in which a laser is used.

2. Description of the Related Art

Conventionally, an optical transmitter using a laser employs a compensator which compensates for variations of threshold current and differential quantum efficiency due to temperature variation or deterioration with the passage of time in an output of the laser.

For example, an automatic power control (hereinafter referred to simply as APC) is disclosed in Japanese Patent Laid-Open No. 90673/1993 that a control loop which receives and converts back light of a laser into a current by means of a photodiode, converts the current into a voltage, determines an average value of the voltage and controls a bias current with the average value and another control loop which detects a peak value of the voltage converted from the output current of the photo-diode and controls a modulation current for driving the laser with the peak value.

FIG. 1 is a block diagram showing an example of a conventional optical transmitter circuit having a function of compensating for variations of threshold current and differential quantum efficiency caused by temperature variation and deterioration with the passage of time of a laser.

Referring to FIG. 1, input signal 1 from an input terminal is applied to driver 43, and laser 4 is driven by driver 43 and bias circuit 42. Part of an output (back light) of laser 4 is monitored and converted into a current by photodiode 5, and the current is converted into a voltage by current/voltage converter 45.

An average value of the output voltage of current/voltage converter 45 obtained by first average value detector 47 and an average value of input signal 1 obtained by second average value detector 48 are compared with each other and the difference between them is amplified by amplifier 49, and bias circuit 42 is controlled with the output of amplifier 49.

Meanwhile, a peak value of the output from current/voltage converter 45 is detected by peak value detector 46, and driver 43 drives laser 4 with the peak value so that laser 4 outputs light.

With the optical transmitter described above, however, in order to compensate for a characteristic variation by temperature variation or deterioration with the passage of time of the laser output, it is required to convert the current for monitoring back light of the laser into a voltage and detect the peak value of the voltage, and this restricts the modulation rate of the optical transmitter.

The reason is that, where the modulation rate is higher than a certain level, the peak value cannot be detected by the peak value detector due to a limitation in frequency characteristic of the photodiode which monitors the back light of the laser.

SUMMARY OF THE INVENTION

It is an object of the present invention to provide an optical transmitter circuit which compensates for temperature variation and deterioration with the passage of time of threshold current and differential quantum efficiency of a laser even when the laser is driven at a high modulation speed and allows production of an optical output having a fixed optical power and free from a pulse width distortion by converting monitor current of the laser into a voltage and detecting an average value of the voltage.

In order to attain the object described above, in an optical transmitter of the present invention, back light of a laser driven by a pulse current driver which receives an input signal is monitored by a photodiode, and the monitor current is converted into a voltage by a current/voltage converter. The voltage is averaged by an average value detector, and the average value is inputted to a bias controller and an operation circuit. Meanwhile, the input signal is also receive into a mark-space ratio detector, by which a mark-space ratio of the input signal is detected, and the mark-space ratio is supplied to both of the bias control circuit and the operation circuit similarly.

The operation circuit makes the main point of the present invention, and divides the average value inputted thereto by the mark-space ratio and outputs a resulting quotient value to a pulse current controller. The output of the operation circuit maintains a fixed value even if the mark-space ratio of the input signal varies, and the pulse current driver is driven with the output of the operation circuit. Further, the bias controller controls the output of the bias circuit so that the bias current of the laser may be substantially equal to threshold current. The laser is driven with the outputs of the pulse current driver and the bias circuit and outputs a required optical signal.

Since the optical transmitter of the present invention employs the operation circuit in place of the conventional peak value detector as described above, an optical output having a fixed optical power and free from a pulse width distortion can be obtained also upon high rate modulation of the laser.

BRIEF DESCRIPTION OF THE DRAWINGS

FIGS. 4(A), 4(B) and 4(C) are time charts illustrating operation of the embodiment of FIG. 2;

FIGS. 5(A), 5(B) and 5(C) are diagrammatic views illustrating operation of the operation circuit of FIG. 2;

FIG. 6 is a diagram illustrating an example of a driving current-optical output characteristic of a laser; and FIG. 7 is a block diagram showing a construction of an operation circuit according to another embodiment of the present invention.

BRIEF DESCRIPTION OF THE PREFERRED EMBODIMENTS

In the following, preferred embodiments of the present invention are described in detail with reference to the drawings.

Figure 2:
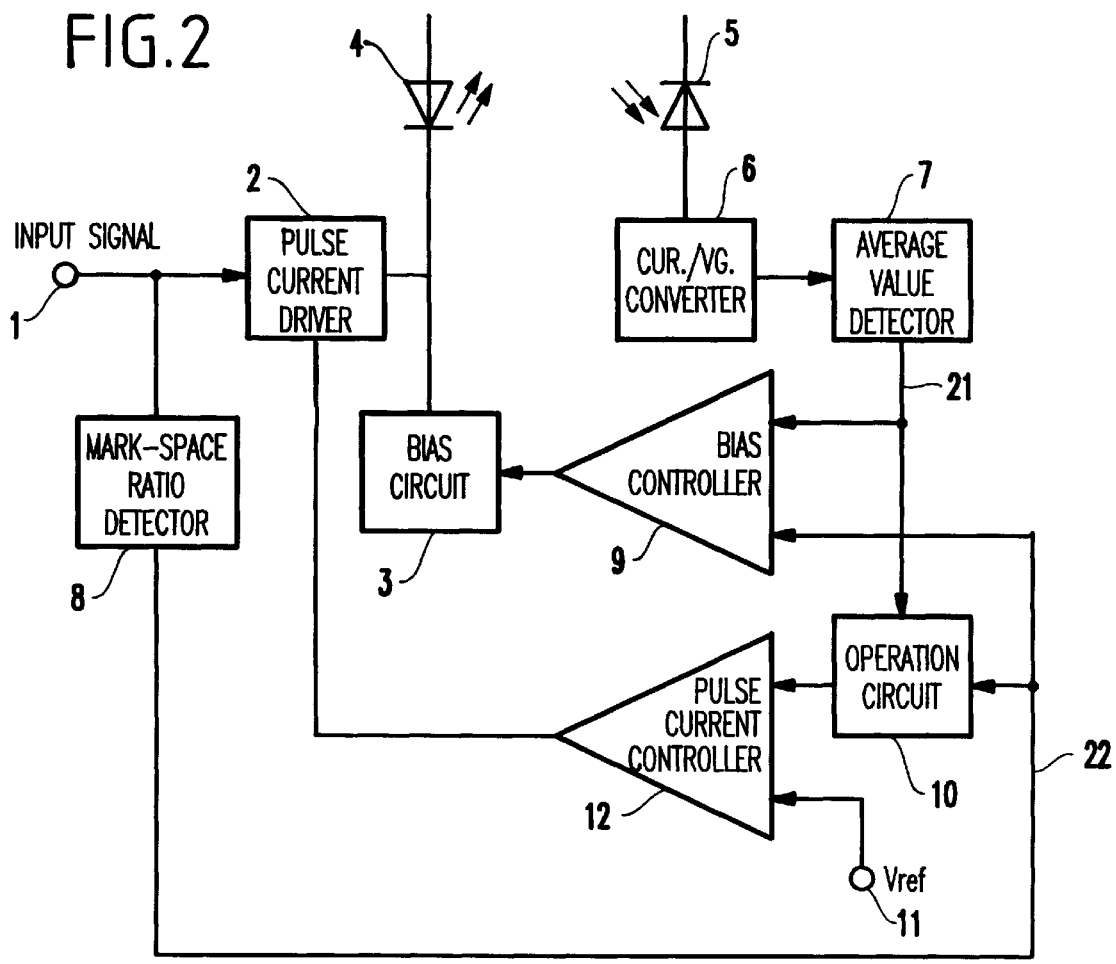
FIG. 2 is a block diagram showing a construction of an optical transmitter according to an embodiment of the present invention.

FIG. 2 is a block diagram showing a construction of an optical transmitter according to an embodiment of the present invention.

In FIG. 2, input signal 1 inputted to pulse current driver 2 which operates under control of output signal from pulse current controller 12. Laser 4 outputs an optical signal driven by both pulse current driver 2 and bias circuit 3.

Back light of the optical output of laser 4 is monitored and converted into a current corresponding to the optical output by photodiode 5, and the current is converted into a voltage by current/voltage converter 6. The voltage is inputted to average value detector 7, by which average voltage 21 is produced.

Output 21 of average value detector 7 is inputted to bias controller 9 which uses, as a reference voltage, output 22 of mark-space ratio detector 8 which detects an mark-space ratio value of input signal 1, and bias circuit 3 is controlled with an output of bias controller 9.

Operation circuit 10 calculates a voltage value corresponding to output 21 of average value detector 7 and output 22 of mark-space ratio detector 8, and an output of operation circuit 10 is inputted to pulse current controller 12 together with reference voltage (Vref) 11, which controls pulse current driver 2.

Operation circuit 10 of a control loop for pulse current which drives laser 4 calculates a peak value of the optical output from output 22 of mark-space ratio detector 8 which detects a mark-space ratio of input signal 1 and output 21 of average value detector 7. The peak value of the optical output is inputted to pulse current controller 12 which uses voltage Vref as reference voltage 11, and pulse current driver 2 is driven with an output of pulse current controller 12. Meanwhile, the bias current of laser 4 is controlled with an output of bias circuit 3. Consequently, the optical output obtained has a fixed optical power and is free from a pulse width distortion irrespective of variation in characteristic of laser 4 as hereinafter described.

Figure 3:
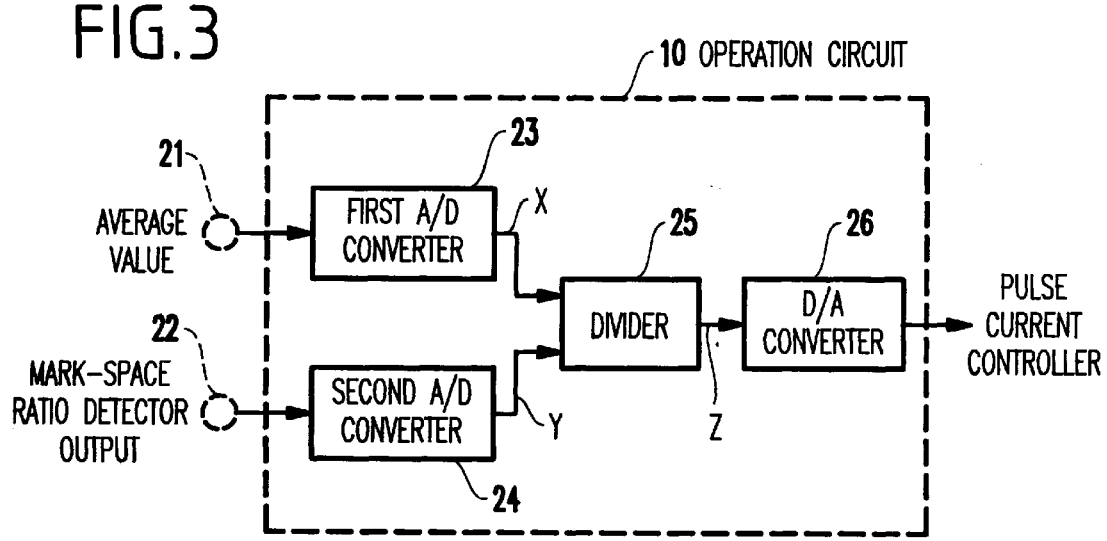
FIG. 3 is a block diagram showing a construction of an operation circuit of FIG. 2.

FIG. 3 is a block diagram showing a construction of operation circuit 10 in the embodiment of the present invention described above. Operation circuit 10 includes first A/D converter 23 and second A/D converter 24 which receive output 21 of average value detector 7 and output 22 of mark ratio detector 8, respectively, and output X and Y of first A/D converter 23 and second A/D converter 24, respectively, to divider 25. Output Z (=X/Y) of divider 25 is inputted to D/A converter 26, and a resulting division output of D/A converter 26 is inputted to pulse current controller 12.

Operation of the circuit of the present embodiment is described below with reference to the drawings.

In FIG. 2, laser 4 is driven by pulse current driver 2 and bias circuit 3, and converts input signal 1 into an optical signal. Part of the output of the optical signal is converted into a current by photodiode 5 and further converted into a voltage by current/voltage converter 6. The voltage is averaged by average value detector 7.

FIGS. 4(A), 4(B) and 4(C) are an example of time charts of the input electric signal, the output of current/voltage converter 6 and the output of average value detector 7 illustrated in FIG. 2, respectively.

Input signal 1 illustrated in FIG. 4(A) is converted into an optical output by laser 4, and part of the optical output is converted into a current by photodiode 5 and further converted into a voltage by current/voltage converter 6. The output voltage of current/voltage converter 6 has such a waveform as seen from FIG. 4(B). The reason why the leading edge rising rate is delayed is that a peak value of the optical output cannot be detected due to a band limitation to a frequency characteristic of photodiode 5 which converts back light of the laser into current.

The optical output average value illustrated in FIG. 4(C) is average voltage 21 of average value detector 7 and indicates an average value of the output of current/voltage converter 6 of FIG. 4(B).

FIGS. 5(A), 5(B) and 5(C) are diagrammatic views illustrating operation of operation circuit 10 in the case of mark-space ratio ½ or ¼.

When average value 21 of the optical output is detected by average value detector 7 as shown in FIG. 5(A) in the case of ½ or ¼ mark-space ratio, peak value of the optical output which are as high as two or four times average value 21 are outputted from operation circuit 10 as seen from the graphs of FIG. 5(C) depending upon a case wherein the mark-space ratio of the input signal detected by the mark-space ratio detection is ½ and another case wherein the mark-space ratio is ¼ as seen from FIG. 5(B).

In FIG. 2, the output of operation circuit 10 corresponds to a peak value of the optical output 21 and is inputted to pulse current controller 12, in which the peak value is compared with a reference voltage (Vref) 11, and amplified. Then pulse current driver 2 is operated with the output of pulse current controller 12.

Since the value of the reference voltage of pulse current controller 12 is a predefined value and the output of operation circuit 10 is kept at a fixed value, even if the mark ratio varies, the optical output is controlled to the fixed level and the output of average value detector 7 is controlled so that the ratio thereof to the peak value of the optical output may be equal to the mark-space ratio detected by mark-space ratio detector 8.

FIG. 6 is a diagram illustrating an example of a driving current-optical output characteristic of the laser.

Referring to FIG. 6, the laser provides an optical output which is substantially in proportion to the driving current higher than the threshold current. Therefore, when the control described above is performed, the ratio between the pulse current average value and the pulse current peak value becomes substantially equal to the ratio between the optical output average value and the optical output peak value.

Here, the bias current of the laser is controlled so as to be substantially equal to the threshold current.

Figure 1:
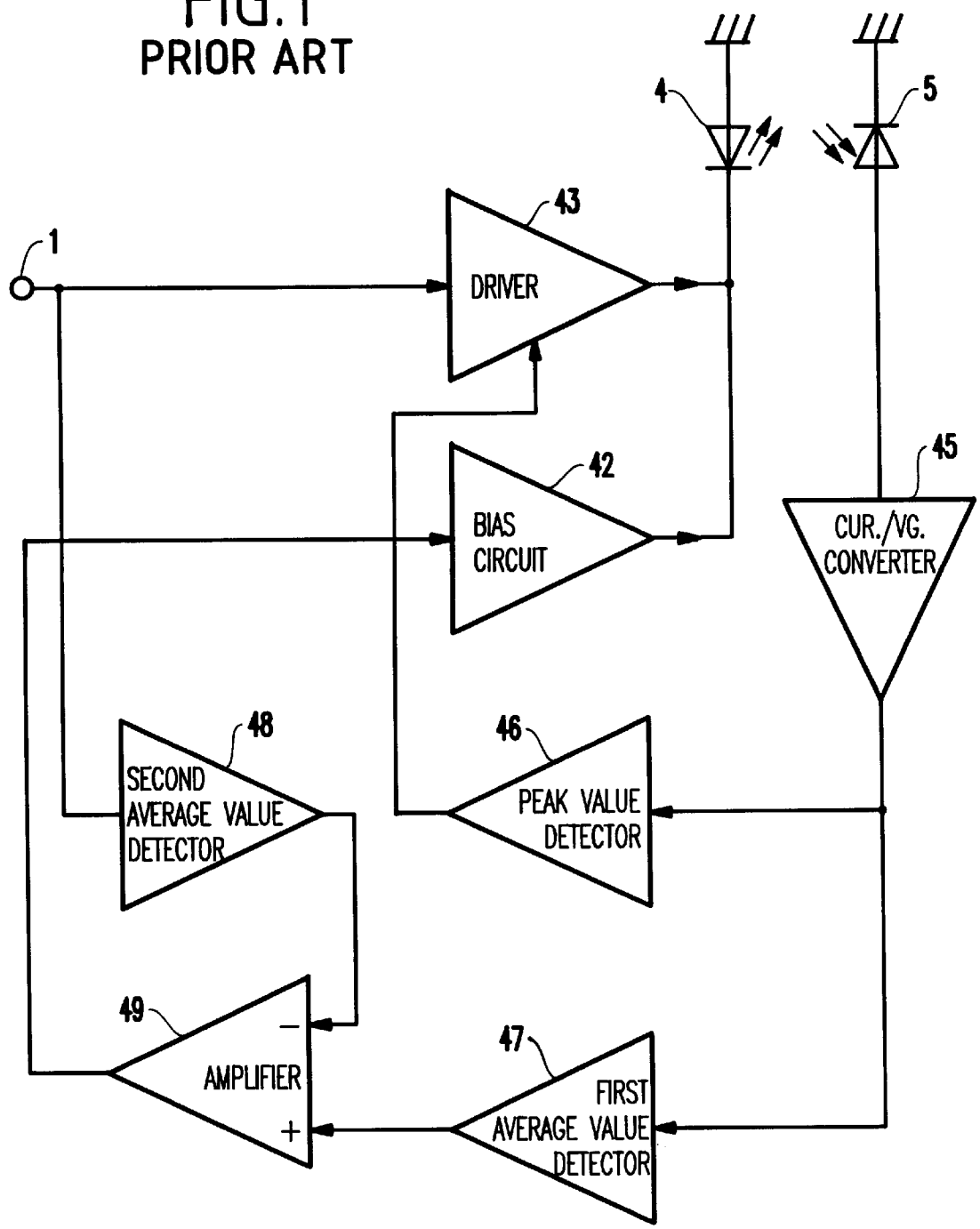
FIG. 1 is a block diagram showing a construction of an optical transmitter according to the prior art.

FIG. 7 is a block diagram showing an internal construction of operation circuit 30 according to another embodiment of the present invention which corresponds to operation circuit 10 of FIG. 1.

Referring to FIG. 7, average value detector output 21 (X) and mark-space ratio detector output 22 (Y) are inputted to a dividing circuit which comprises multiplier 33, operational amplifier 34 and inverter 35. Consequently, the level of an input signal to pulse current controller 12 is determined by the output (Z=X/Y) of the dividing circuit and is used to control the pulse current for driving the laser.

While the operation of the embodiments of the present invention is described above with reference to the drawings, the present invention is not limited to the embodiments and includes various variations and modifications which fall within the spirit or scope of the present invention.

As described above, the present invention is advantageous in that it compensates for variations of the threshold current and the differential quantum efficiency caused by temperature variation or deterioration with the passage of time of a laser even upon high speed modulation of the laser thereby to allow production of an optical output having a fixed optical power and free from a pulse width distortion.

The reason is that, since the present invention eliminates the necessity for a peak value detection circuit for a modulation signal in a control loop, the optical power is not limited by the frequency characteristic of a photodiode.

What is claimed is:

1. An optical transmitter, comprising:
   a laser for converting an electric signal into an optical signal;
   a pulse current driver for receiving an input signal and driving said laser according to a control signal inputted thereto separately;
   a bias circuit for cooperating with said pulse current driver to drive said laser in order to provide a bias for keeping an optical output level of said laser at a predetermined value;
   a mark-space ratio detector for detecting a mark-space ratio of the input signal;
   a photodiode for detecting back light of said laser and outputting monitor current of the optical signal;
   a current/voltage converter for converting the monitor current from said photodiode into a voltage;
   an average value detector for outputting an average value of the output of said current/voltage converter;
   a bias controller for comparing the average value with the mark-space ratio, amplifying a difference between the average value and the mark ratio and outputting a signal for controlling said bias circuit;
   an operation circuit for receiving the average value and the mark-space ratio and performing a predetermined operation; and
   a pulse current controller for comparing a result of the operation of said operation circuit with a fixed reference voltage, amplifying a difference obtained by the comparison and outputting the amplified difference as the control signal for said pulse current driver.

2. An optical transmitter as claimed in claim 1, wherein said operation circuit divides the average value by the mark-space ratio and outputs a resulting quotient.

3. An optical transmitter as claimed in claim 1, wherein said operation circuit comprises a first A/D converter and a second A/D converter for receiving and A/D converting the average value and the mark-space ratio, respectively, a divider for dividing an output of said first A/D converter by an output of said second A/D converter, and a D/A converter for D/A converting and outputting an output of said divider.

4. An optical transmitter as claimed in claim 1, wherein said operation circuit comprises an operational amplifier with negative and positive input terminals connected to said average value detector via a resistor and to the ground, respectively; a multiplier for producing a product of said mark-space ratio and the output of said operational amplifier; and an inverter for feeding back an inverse of said product to said negative input terminal of said operational amplifier via another resistor.

5. An optical transmitter as claimed in claim 2, wherein said operation circuit comprises:
   a first A/D converter and a second A/D converter for receiving and A/D converting the average value and the mark-space ratio, respectively;
   a divider for dividing an output of said first A/D converter by an output of said second A/D converter; and
   a D/A converter for D/A converting and outputting an output of said divider.

6. An optical transmitter as claimed in claim 2, wherein said operation circuit comprises:
   an operational amplifier with negative and positive input terminals connected to said average value detector via a resistor and to the ground, respectively;
   a multiplier for producing a product of said mark-space ratio and the output of said operational amplifier; and
   an inverter for feeding back an inverse of said product to said negative input terminal of said operational amplifier via another resistor.

* * * * *